(12) United States Patent  
Dose

(10) Patent No.: US 9,182,077 B2  
(45) Date of Patent: Nov. 10, 2015

(54) TENTACLE GRIP SUCTION HOLDER FOR HANDHELD ELECTRONICS

(71) Applicant: Hans Edward Dose, Huntington Beach, CA (US)

(72) Inventor: Hans Edward Dose, Huntington Beach, CA (US)

(*) Notice: Subject to any disclaimer, the term of this patent is extended or adjusted under 35 U.S.C. 154(b) by 0 days.

(21) Appl. No.: 14/252,784

(22) Filed: Apr. 15, 2014

(65) Prior Publication Data

US 2015/0292672 A1    Oct. 15, 2015

(51) Int. Cl.
| A47G 29/00 | (2006.01) |
| F16M 13/02 | (2006.01) |
| G06F 1/16 | (2006.01) |
| H05K 5/02 | (2006.01) |

(52) U.S. Cl.
CPC ........... *F16M 13/022* (2013.01); *G06F 1/1613* (2013.01); *H05K 5/023* (2013.01); *H05K 5/0234* (2013.01)

(58) Field of Classification Search
USPC .......... 248/683, 688, 693, 465.1, 467, 206.5, 248/309.4, 351; 361/679.56
See application file for complete search history.

(56) References Cited

U.S. PATENT DOCUMENTS

| 5,114,110 A * | 5/1992 | Vohora ......................... 248/444 |
| 6,206,542 B1 * | 3/2001 | Case et al. .................... 362/190 |
| 6,540,184 B2 * | 4/2003 | Thaxton ........................ 248/160 |
| 7,568,670 B2 * | 8/2009 | Wang ......................... 248/205.3 |
| 7,798,452 B1 * | 9/2010 | Wessells et al. ............ 248/163.1 |
| D679,122 S * | 4/2013 | Rojas ............................. D6/525 |
| 8,616,422 B2 * | 12/2013 | Adelman et al. ............. 224/191 |
| 8,672,278 B1 * | 3/2014 | Wessells et al. ........... 248/163.1 |
| 8,675,352 B2 * | 3/2014 | Wessells et al. ......... 361/679.01 |
| 2003/0209642 A1 * | 11/2003 | Fontana et al. .......... 248/231.91 |
| 2005/0205730 A1 * | 9/2005 | Carnevali .................. 248/163.1 |
| 2009/0095854 A1 * | 4/2009 | Forbes et al. ............. 248/176.3 |
| 2010/0021155 A1 * | 1/2010 | Orzeck et al. ................. 396/428 |
| 2010/0220992 A1 * | 9/2010 | Bevirt ......................... 396/428 |
| 2010/0294908 A1 * | 11/2010 | Mish et al. .................... 248/451 |
| 2010/0314508 A1 * | 12/2010 | Bevirt et al. ................. 248/121 |
| 2011/0286217 A1 * | 11/2011 | Martinson et al. ........... 362/253 |
| 2012/0019113 A1 * | 1/2012 | Hale .......................... 312/223.1 |
| 2012/0198680 A1 * | 8/2012 | Durben et al. ................. 29/428 |
| 2013/0161455 A1 * | 6/2013 | DeJong .................... 248/176.3 |
| 2013/0187020 A1 * | 7/2013 | Trotsky ..................... 248/309.3 |
| 2013/0193909 A1 * | 8/2013 | Blevins ........................ 320/107 |

* cited by examiner

Primary Examiner — Bradley Duckworth

(57) ABSTRACT

A handheld electronic device holder with three tentacle-like appendages to be manually positioned by a user to mount or suction onto a stationary object while receiving a flat portion of a handheld electronic device to be suctioned to. The invention is positioned by the user to comfortably and easily point the display of the electronic device towards the users visual focus to allow a hands-free viewing experience.

5 Claims, 6 Drawing Sheets

TENTACLE GRIP SUCTION HOLDER FOR HANDHELD ELECTRONICS

BACKGROUND

The present invention improves the interaction with handheld electronic devices such as mp3 players, smartphones and other electronic devices under the users discretion by holding said devices in a fixed position.

Users of electronic handheld devices require support in keeping a consistent view of their devices display while simultaneously engaging in everyday activities. For example some activities in which a user may need to have a view of their handheld electronic device may include but are not limited to: Driving an automobile, riding a bicycle, operating a motorized vehicle, cooking, playing an instrument, typing on a computer, and other scenarios under the users discretion.

This invention may be used in any scenario which the user is primarily engaged in an activity that requires some concentration and while the user also requires accessibility to their handheld electronic device.

In the use of electronic handheld device holders, the user will frequently wish to adjust the position of the holder depending upon the demands of the immediate situation. Once the electronic device is attached to the holder, the holder is mounted to a stationary object and the portion of the holder that is attached to the electronic device has been arranged in the desired position, the holder stays in place and is rendered ready for use.

In the past, electronic device holders have been purposed for only one scenario of use and with only one specific electronic device, as well as being too complicated for the average user, too bulky for easy transport, aesthetically displeasing, and lacking a unique interactive and visual experience that resembles a fictional creature.

SUMMARY OF THE INVENTION

Therefore, it is a primary objective of the present invention to provide an improved and more universal system for holding an electronic handheld device.

Furthermore, it is an objective of the present invention to provide a completely adjustable holder for electronic devices.

Other and further objectives of the present invention will become apparent to those skilled in the art upon a study of the following specification, appended claims and accompanying drawings.

TECHNICAL FIELD

This invention is related to personal articles, and more particularly to an improved cell phone holder.

DESCRIPTION OF EMBODIMENTS

Referring initially to FIGS. 1-6, where like numerals indicate like and corresponding elements, a handheld electronic device holder 1 comprising a sequence of suction cups 2a,2b, 2c,2d,2f,2g,2h,2i,2j lined in a row that follow along the bottom length of three bendable silicone support tentacles 4a,4b, 4c.

Figure 1:
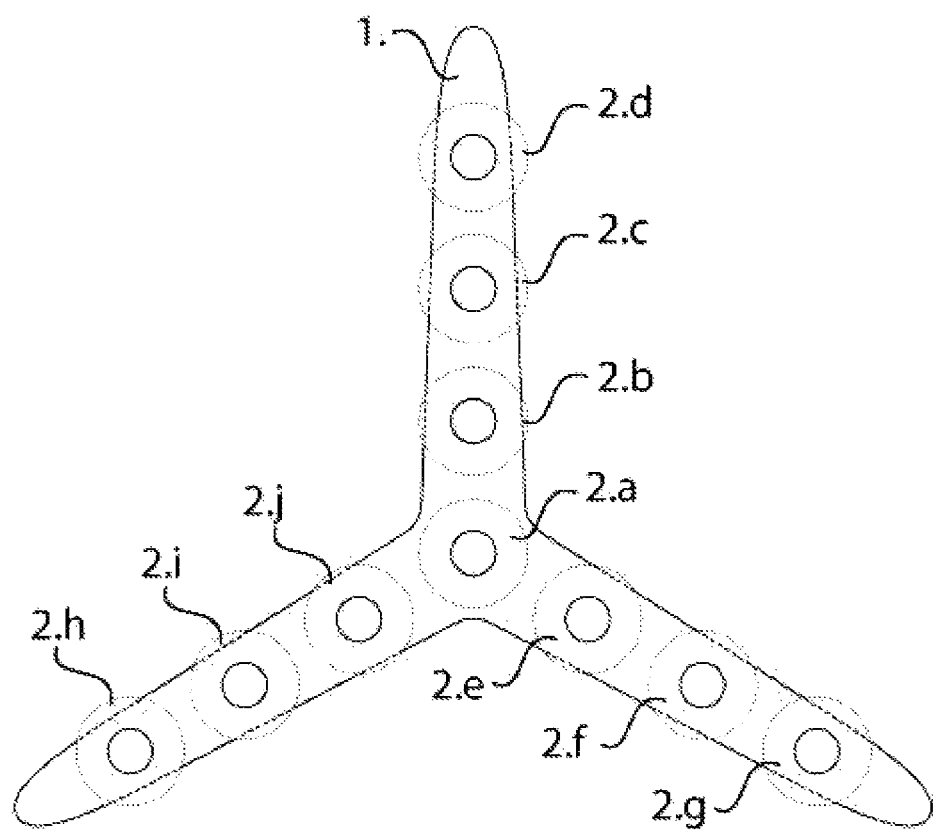
FIG. 1 A direct view from the bottom of the present invention.
Figure 2:
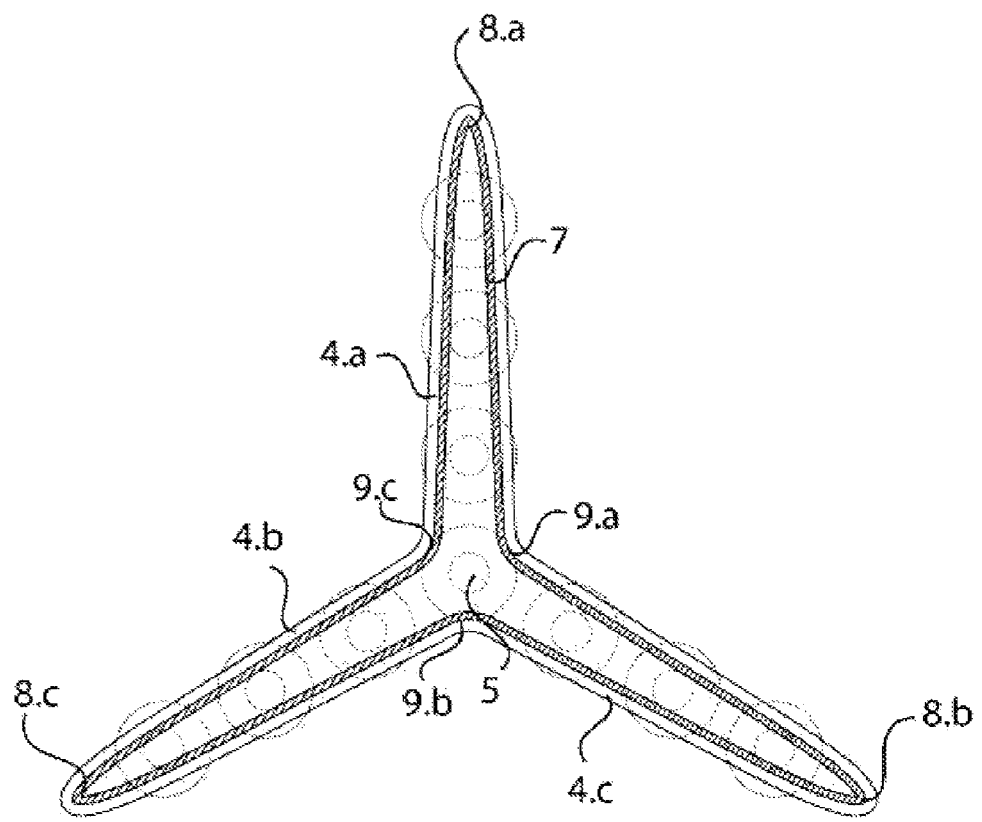
FIG. 2 A birds-eye top view of the present invention viewing through the silicone encasement to show the internal metal wire.
Figure 3:
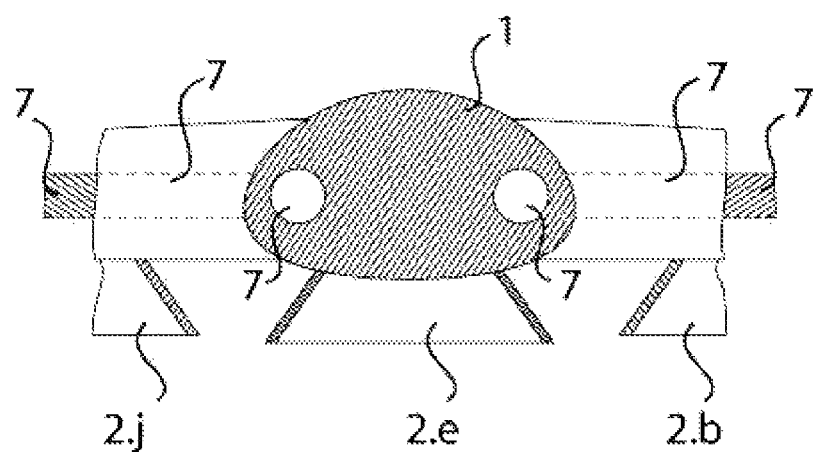
FIG. 3 A cutaway view of the presentation as seen from one side.

The three bendable silicone support tentacles 4a,4b,4c are joined at a single center axis 5 in which they fan outwards in an array shown in FIGS. 1 and 2. The three bendable silicone support tentacles 4a-c are equally angled from center to center at exactly one hundred and twenty degrees in reference to each other.

The ends of three bendable silicone support tentacles 4a-c extend approximately six inches outwards from the center axis 5.

The handheld electronic device holder 1 encases a metal wire 7 not seen by the user. Said metal wire follows the outer contour shape of the handheld electronic device holder 1 when viewing from the perspective of an above vantage point shown in FIG. 2.

The metal wire 7 is closed with no endpoints and curves back towards the center axis 5 when reaching the ends 8a,8b, 8c of the three bendable silicone support tentacles 4a-c, and curves along each joining angle 9a,9b,9c of the three bendable silicone support tentacles 4a-c.

The metal wire 7 is approximately one eighth inch diameter and is comprised of any alloy or metal that is highly ductile so it can be manipulated into a position and maintain this position until manipulated further by the user.

The sequence of suction cups 2a-k are individually approximately one inch diameter and are spaced approximately one and a half inches from center to center starting with 2a being directly in the center of the axis 5 of the holder 1. The suction cups 2a-k repeat outwards from the axis 5 in a single file row directly along the center of the three support tentacles 4a-c.

Figure 4:
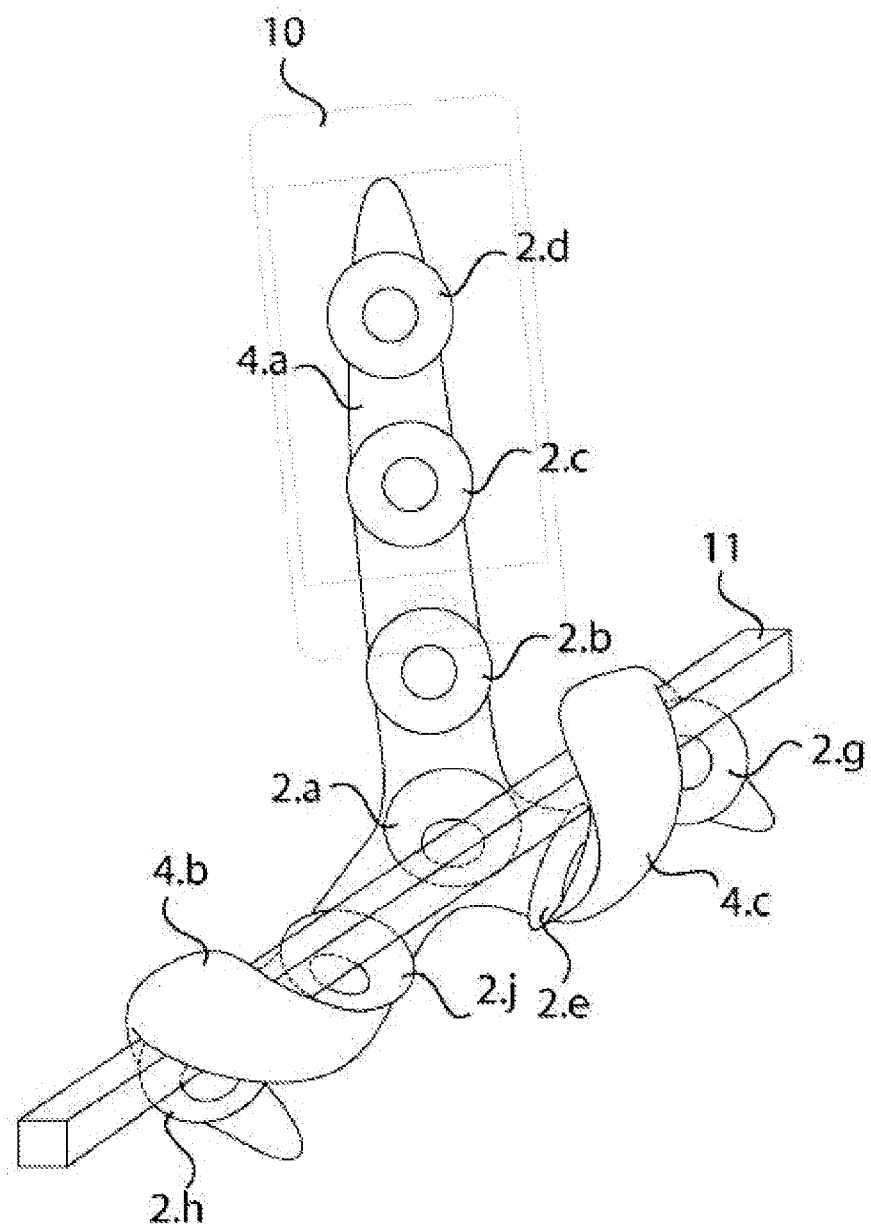
FIG. 4 A demonstration of the present invention being used in one scenario of wrapping the tentacles around an object to be mounted and suctioning a handheld electronic device to the remaining silicone tentacles featuring suction cups.
Figure 5:
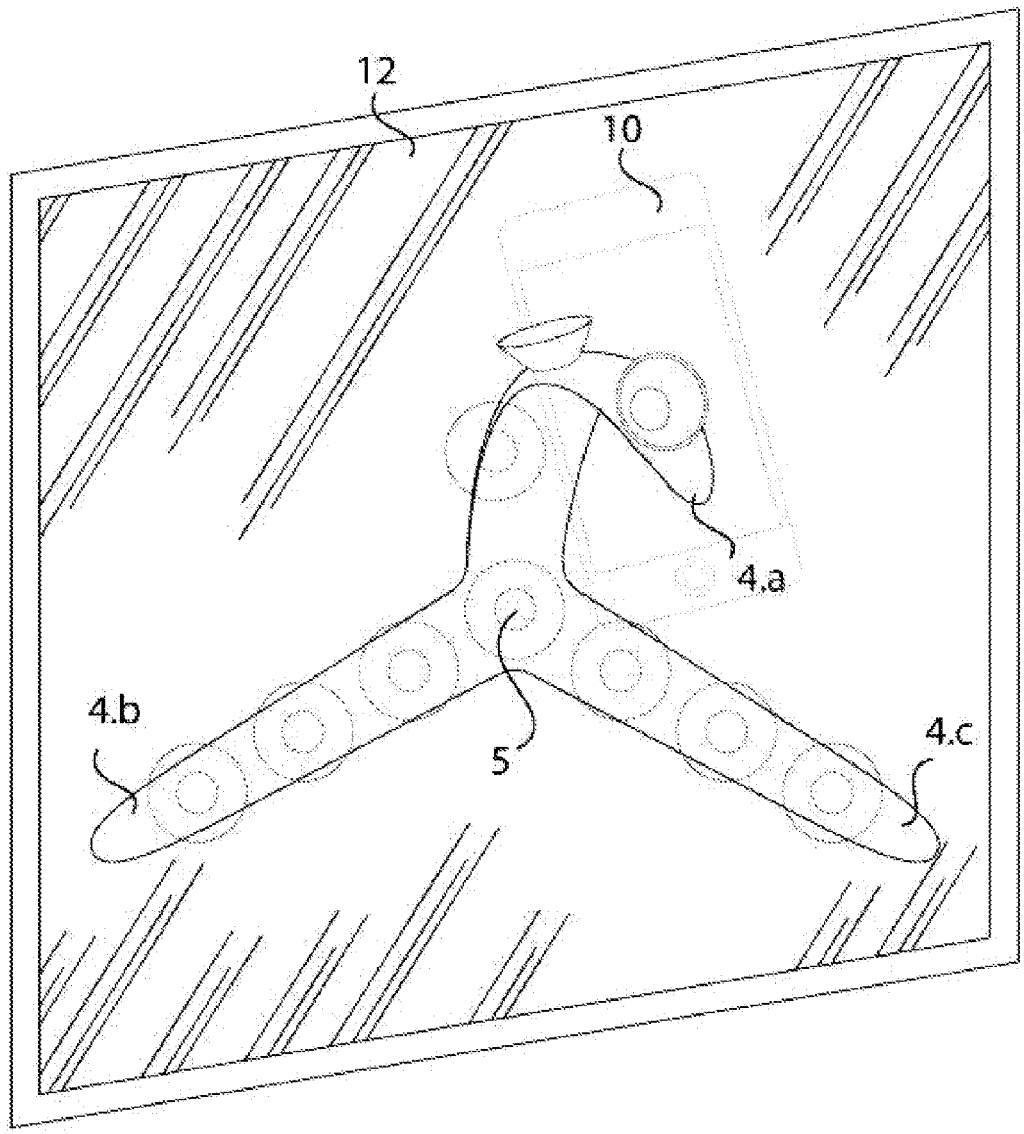
FIG. 5 A demonstration of the present invention being used in one scenario of suctioning the tentacle to a smooth flat surface to be mounted and suctioning a handheld electronic device to the remaining silicone tentacles featuring suction cups.
Figure 6:
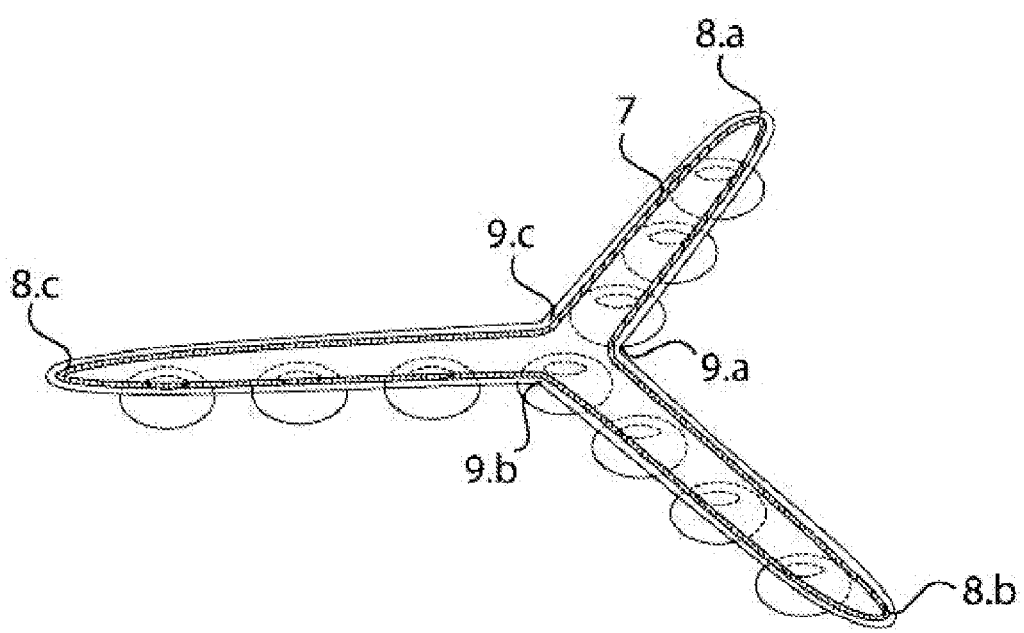
FIG. 6 A three-quarter view of the invention viewing through the silicone encasement to show the internal metal wire.

An electronic handheld device 10 can be fashioned to the present invention through the user adhering one or more of the suction cups 2a-k to a large enough smooth flat surface region of the handheld electronic device 10 that can accommodate the approx one inch diameter suction cups 2a-j, shown in FIGS. 4 and 5.

There are two ways the handheld electronic device holder 1 can be mounted by the user to a stationary position. For the first option, the user can wrap one or more of the remaining support tentacles 4a-c that encase the highly ductile metal wire 7 around a mounting object 11 that possesses a protrusion or shaft. The protrusion 11 must be small enough in diameter to accommodate the bendable support tentacles 4a-c, which will encompass around the protrusion 11 shown in FIG. 4.

For the second option, the user can adhere one or more of the remaining suction cups 2a-k that follow along the center of the support tentacles 4a-c to a smooth flat surface 12 that has an area large enough to accommodate one or more of the approx one inch diameter gripping suction cups 2*a-k* shown in FIG. 5.

The invention claimed is:

1. Tentacle Grip Suction Holder, comprised of:
a plurality of legs disposed about a center, each of the legs having a metal core and a layer of an impermeable elastomeric material, the legs being flexible and malleable to allow a user to bend the legs into a desired form and to retain that shape, the legs having a sequence of two or more gripping suction cups lined in a row along one side.

2. The Tentacle Grip Suction Holder of claim 1 wherein an electronic handheld device could be fixed to one or more of the gripping suction cups.

3. The Tentacle Grip Suction Holder of claim 2 wherein said electronic handheld device can be positioned and adjusted to a user's desired position by bending one or more of said flexible and malleable legs relative to the electronic handheld device.

4. The Tentacle Grip Suction Holder of claim 1 wherein one or more of the gripping suction cups can adhere to a stationary object or a mounting surface.

5. The Tentacle Grip Suction Holder of claim 1 wherein a user could fix the Tentacle Grip Suction Holder to a stationary object or a mounting object by bending one or more of said flexible legs around the stationary object or mounting object, securing the Tentacle Grip Suction Holder to the stationary object or mounting object.

* * * * *